(12) United States Patent
Roellig et al.

(10) Patent No.: US 6,754,244 B2
(45) Date of Patent: Jun. 22, 2004

(54) DIODE LASER COMPONENT

(75) Inventors: Ulrich Roellig, Jena (DE); Dirk Lorenzen, Jena (DE)

(73) Assignee: Jenoptik Laserdiode GmbH, Jena (DE)

( * ) Notice: Subject to any disclaimer, the term of this patent is extended or adjusted under 35 U.S.C. 154(b) by 0 days.

(21) Appl. No.: 10/103,169

(22) Filed: Mar. 20, 2002

(65) Prior Publication Data

US 2002/0136250 A1 Sep. 26, 2002

(30) Foreign Application Priority Data

Mar. 21, 2001 (DE) .......................................... 101 13 943

(51) Int. Cl.⁷ .............................. H01S 3/00; H01S 5/00
(52) U.S. Cl. ........................................... 372/36; 372/50
(58) Field of Search .............................. 372/36; 62/3.7; 438/106; 219/497; 385/92

(56) References Cited

U.S. PATENT DOCUMENTS

| | | | | |
|---|---|---|---|---|
| 5,454,002 A | * | 9/1995 | McCann | 372/36 |
| 5,734,771 A | * | 3/1998 | Huang | 385/93 |
| 5,911,897 A | * | 6/1999 | Hamilton | 219/497 |
| 6,027,957 A | * | 2/2000 | Merritt et al. | 438/106 |
| 6,055,815 A | * | 5/2000 | Peterson | 62/3.7 |
| 6,101,206 A | * | 8/2000 | Apollonov et al. | 372/50 |
| 6,155,724 A | * | 12/2000 | Ichino et al. | 385/92 |
| 6,240,116 B1 | * | 5/2001 | Lang et al. | 372/50 |

FOREIGN PATENT DOCUMENTS

| | | |
|---|---|---|
| DE | 197 46 204 | 4/1999 |
| DE | 198 21 544 | 12/1999 |
| FR | 2 797 556 | 2/2001 |
| WO | WO 98/35410 | 8/1998 |

OTHER PUBLICATIONS

Klein und wirtschaftlich: Industrielle Hochleistungsdiodenlaser "Small and economical: industrial high–power diode lasers" C. Brettschneider, et al. LaserOpto, 31 (1), 1999 (pp. 68–70), no month.

* cited by examiner

*Primary Examiner*—Paul Ip
*Assistant Examiner*—Hung T Vy
(74) *Attorney, Agent, or Firm*—Reed Smith LLP

(57) ABSTRACT

A diode laser component is disclosed for providing a passive cooling heatsink with improved heat spreading such that a diode laser component which uses a heatsink of this type is constructed so as to be thermally symmetrical and compact and can be used for multiple purposes, particularly as regards beam control and electrical circuitry. The heatsink, which carries a diode laser bar on a mounting surface, contains an area for heat spreading which is enclosed by material and surrounds all edges of the mounting surface. Recesses for fastening of elements are arranged in the heatsink outside of the area for heat spreading.

39 Claims, 3 Drawing Sheets

DIODE LASER COMPONENT

CROSS-REFERENCE TO RELATED APPLICATIONS

This application claims priority of German Application No. 101 13 943.8, filed Mar. 21, 2001, the complete disclosure of which is hereby incorporated by reference.

BACKGROUND OF THE INVENTION a) Field of the Invention

The invention is directed to a diode laser component with a diode laser bar on a mounting surface of a passive cooling heatsink and a cover element for the diode laser bar, wherein the heatsink and the cover element are constructed so as to be electrically conductive and contain recesses for fastening of elements.

b) Description of the Related Art

Solid heatsinks in which the cooling effect is brought about through heat conduction are typically used for passive cooling of high-power diode laser bars. However, if needed, a heat pipe structure can be provided, in addition, for passive convection evaporative cooling.

The object of the heatsink, aside from mechanical support, is above all to cool the high-power diode laser bar mounted on a mounting surface on its upper side. In this connection, it is especially important that sufficient heat spreading is ensured for increased cooling efficiency and that the steps taken in this regard can be reconciled with other requirements of a diode laser component. In particular, this concerns the use of collimating optics, if needed, and the supply of increasingly higher electric power. For reasons of space, the dimensioning of the heatsink should be determined by the measurements which, for thermal reasons, are required for the heat spreading of the energy loss. This applies in particular to the lateral dimension in the plane of the heatsink surface vertical to the radiating direction of the diode laser bar. However, care must be taken in this regard to ensure the thermal symmetry of the heatsink with respect to the diode laser bar because, otherwise, the diode laser bar would have warmer and colder areas during operation.

Heatsinks comprising electrically conductive material are usually fastened to a conductive base plate through which the current supply is effected. While the heatsink is constructed as anode (p-contact), the n-contact is produced through a cover of the high-power diode laser bar. When a plurality of diode laser components must be used in operation simultaneously, a design of this kind causes difficulties because of the preferability of an electric series connection whose demands on the power supply and electric supply lines are not as exacting as those of a parallel circuit.

OBJECT AND SUMMARY OF THE INVENTION

It is the primary object of the invention to provide a passive cooling heatsink with improved heat spreading such that a diode laser component which uses a heatsink of this type has a thermally symmetrical and compact construction and can be used for multiple purposes, particularly as regards beam control and electrical circuitry.

This object is met according to the invention by a diode laser component of the type mentioned in the beginning in that the heatsink contains an area for heat spreading which is enclosed by material and surrounds all edges of the mounting surface, wherein the recesses for fastening the elements are arranged in the heatsink outside of this area.

A thermal symmetry guaranteed in this way ensures a uniform temperature distribution in the diode laser bar.

For purposes of unobstructed beam propagation, a bevel at a part of the heatsink located in front of the mounting surface in the emitting direction of the diode laser bar has an angle of inclination that is adapted to the radiating angle of the diode laser bar.

It is particularly advantageous for receiving optical imaging elements, e.g., collimating optics, when the heatsink contains a step between the mounting surface and the bevel, which step has a receiving surface extending parallel to the mounting surface. The projection of the heatsink protruding over the collimating optics has an added positive effect in that it protects the optics and the diode laser bar from mechanical influences.

A bore hole which receives a temperature sensor and which is adjacent to the area for heat spreading adjoins the mounting surface on at least one side in direction vertical to the emission direction of the diode laser bar.

The symmetric arrangement of temperature sensors on both sides of the diode laser bar and their proximity to the edge of the area for heat spreading are particularly advantageous. In this way, without obstructing the heat spreading area, detection of measurements coming close to the actual temperature ratios below the diode laser bar is ensured, and disturbances or defects in the diode laser bar can be deduced from the detected measurements by means of the symmetric measuring construction in case of a discrepancy between temperature measurements.

Therefore, one bore hole of a pair of bore holes in the mounting surface which serve to receive sensor elements for temperature measurement should be adjacent to and should adjoin the area for heat spreading at each side in a direction vertical to the emission direction of the diode laser bar, wherein the distances of the bore holes from the mounting surface should be identical.

Bore holes are advantageously arranged eccentrically in the heatsink and cover element on the side of the diode laser bar facing away from the emission direction for purposes of fastening electrical contacts.

On the one hand, this facilitates a series connection of a plurality of diode laser components and on the other hand provides for more flexible use when the cover element has a base surface and a top surface, both of which are suitable as connection surfaces for connecting to the heatsink. The bore holes which are arranged eccentrically in the heatsink and cover element can therefore be placed either next to one another in a direction vertical to the emission direction of the diode laser bar or coaxially one over the other, depending on the choice of connection surface.

Further, arranging the electric contacts in the back ensures that the electric supply lines are protected against damage by laser radiation and that the diode laser component remains compact itself without interfering with the heat spreading.

Very high currents (up to 100 A) can be supplied to the laser diode component when the bore holes for fastening the electric contacts are constructed as threaded bore holes by which pole pieces of power cables can be fastened by screws. In order to increase operating safety, the bore holes have different diameters so as to eliminate confusion.

The diode laser component is particularly suited to a potential-free construction; this applies to the individual element as well as to a series connection of a plurality of diode laser components, since the heatsink has separate areas for power supply and heat dissipation. While the heatsink can be fastened to a cooling plate by its base surface so as to be electrically insulated, the screw connection provided for one electric contact (p-contact) is positioned in a practical manner just like the screw connection at the cover element.

It is also advantageous when the heatsink and the cover element can be electrically short-circuited with one another, which can be achieved, e.g., by means of a detachable screw connection.

The area for heat spreading which is enclosed by material can comprise one material or different materials. The latter is especially beneficial when the area for heat spreading which is enclosed by material contains at least one graphite core which is enclosed by another heatsink material.

Also, it is advantageous when the mounting surface is arranged on a substrate which is provided as a material part of the heatsink and whose heat conductivity exceeds that of metals and which can also be subdivided into partial substrates.

A particularly advantageous heatsink can be constructed when copper tungsten or copper molybdenum is used as heatsink material in combination with the enclosed graphite core and when the mounting surface is arranged on a metallized substrate which is provided a material part of the heatsink and which comprises monocrystalline silicon carbide.

Finally, the cover element or the heatsink can be used to carry an evaluating device for detecting measurements, converting measurements and possibly also for storing measurements, so that unnecessarily long transmission paths are avoided.

The invention will be described more fully in the following with reference to the schematic drawings.

DESCRIPTION OF THE PREFERRED EMBODIMENTS

Figure 1:
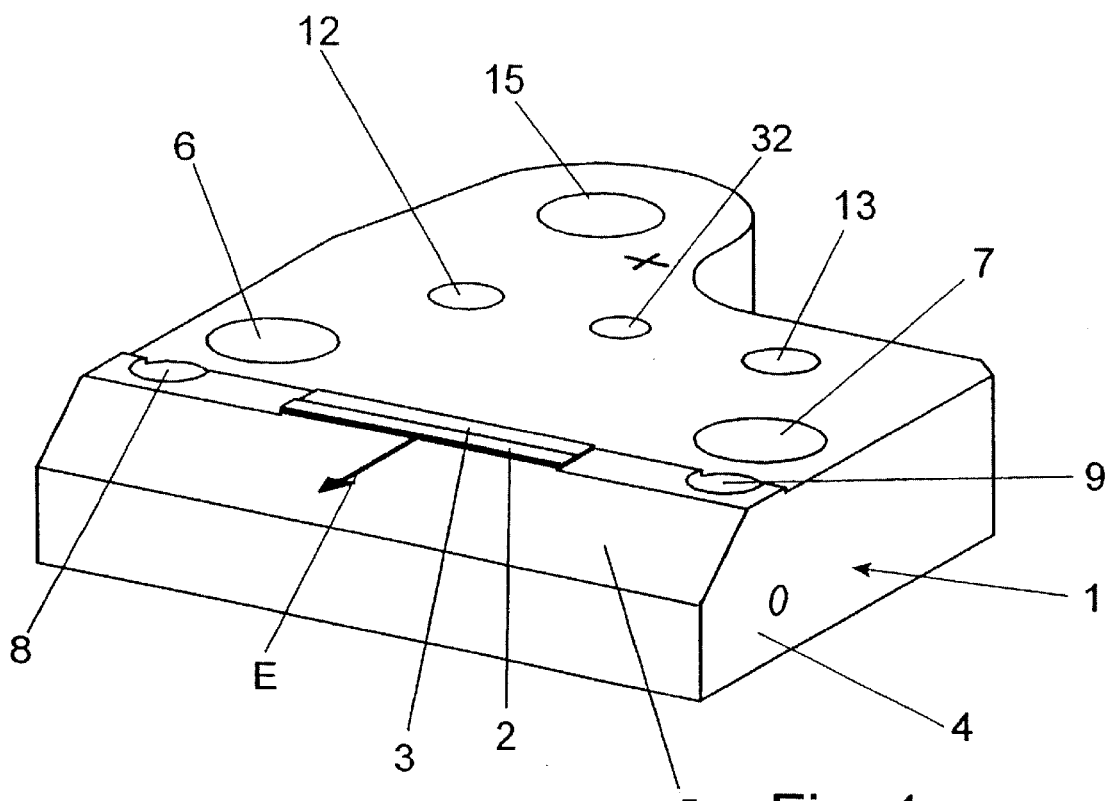
FIG. 1 shows a heatsink with improved heat spreading which operates without collimating means.

According to FIG. 1, a heatsink 1 comprising a solid copper block for receiving a diode laser bar 2 contains a mounting surface 3 which is offset to the rear relative to a border of the heatsink 1 situated in the emission direction E of the diode laser bar 1. A projection 4 which is formed in this way is provided with a bevel 5 whose angle of inclination is adapted to the radiating angle of the diode laser bar 2 for unobstructed radiation in an open radiating area. The angle of inclination of the bevel 5 can range from 30° to 60° relative to the mounting surface 3.

The improved heat spreading is achieved in that the mounting surface 3 is surrounded on all edges by an area for heat spreading which is enclosed by material. The projection 4 has a particularly advantageous effect because it causes spreading in a direction component of the beam propagation. All obstructions which could influence a cohesive material structure of the heatsink 1, e.g., recesses constructed as bore holes for fastening elements in the form of electric contacts, connection elements and sensor elements, are situated outside of this area which is constructed on all sides below the mounting surface 3 as a pyramid-shaped structure and which widens to the edges of the heatsink 1 preferably by a 45-degree inclination of the side surfaces of the pyramid. This step particularly affects bore holes 6, 7 for fastening the heatsink 1 to a cooling base plate, not shown, and a pair of blind bore holes 8, 9 for receiving temperature sensors which are designated by 10 and 11 in FIGS. 3 and 4. The latter adjoin the heat spreading area especially closely in order to concentrate the temperature measurement in the immediate vicinity of the diode laser bar 2. In this way, a control loop, not shown, can be supplied with relevant measurement values for effective regulation.

The temperature sensors 10 and 11 primarily supply an analog voltage value as measurement which, e.g., can be based on a resistance measurement. Since long paths between temperature sensors 10 and 11 and evaluating electronics can falsify measurement results, the diode laser component according to the invention offers the possibility of receiving the evaluating electronics in addition. This is illustrated by dashes in FIG. 4, where the cover element 14 is constructed in such a way that it can carry an electronic evaluating device AE for detection, conversion and, as the case may be, also storage of measurement values.

In another construction, it is also possible to fasten the evaluating device AE, together with the temperature sensors 10 and 11, to the heatsink 1.

Additional bore holes 12, 13 constructed as threaded bore holes are likewise incorporated in the copper block for fastening a cover element 14 outside the area for heat spreading.

In order to achieve a potential-free construction with the heatsink according to the invention, the connection to the base plate, not shown, is electrically insulated. This can be carried out, for example, with an electrically nonconductive base surface coating of the heatsink 1. In this case, the power supply is effected through a threaded bore hole 15 by which a pole piece of a power cable can be fastened by means of a screw connection. The threaded bore hole 15 is arranged in the heatsink 1 on the side of the diode laser bar 2 facing away from the emission direction E eccentrically and adjacent to one of the bore holes 12, 13—in this case, bore hole 12. The compactness of a diode laser component produced with heatsink 1 is helpful when the heatsink 1 extends beyond one of the bore holes 12 or 13 in a direction opposite to the emission direction E only on the half in which the threaded bore hole 15 is located.

In another construction (FIG. 2), collimating optics can be arranged in the beam path in front of the diode laser bar 2 in a simple manner without special provisions for adapting. For this purpose, the projection between the mounting surface 3 and the bevel 5 has a step 16 with a receiving surface 17 extending parallel to the mounting surface 3, the height of the step 16 being adapted to the dimension of the collimating optics. In the present embodiment example, this height corresponds to half the lens diameter of the collimating optics, not shown.

Figure 2:
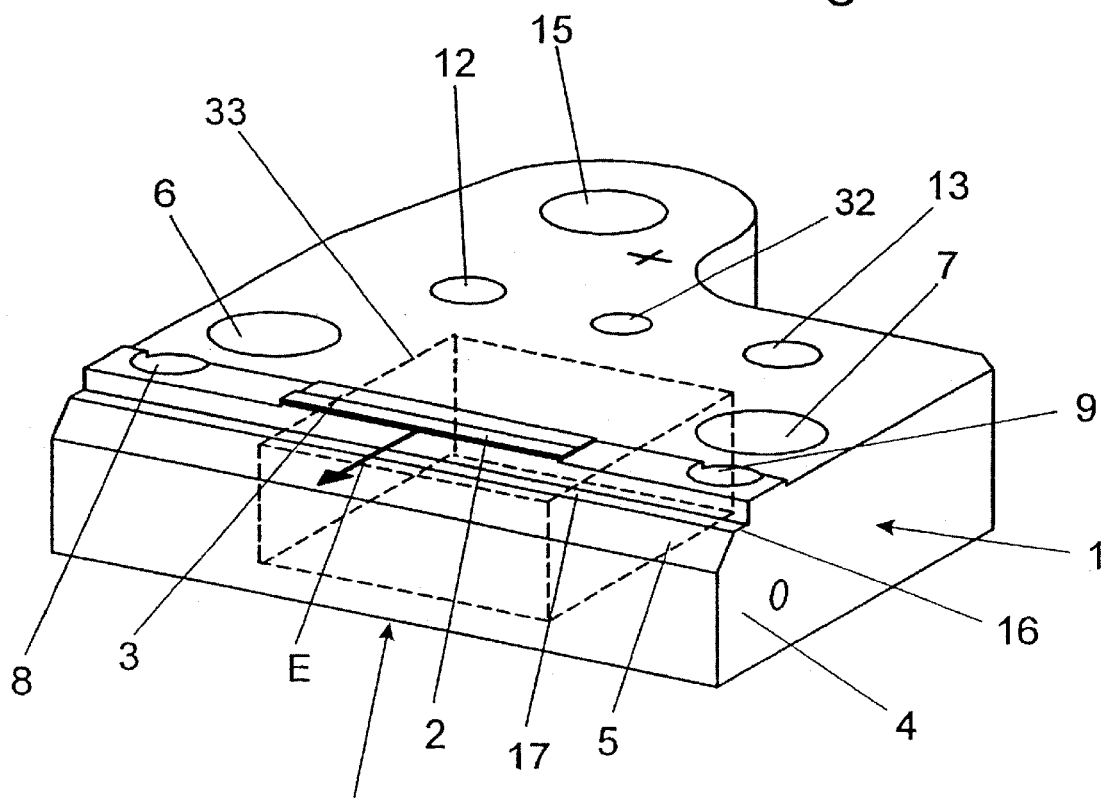
FIG. 2 shows a heatsink with improved heat spreading which permits collimating optics to be mounted in a simple manner.
Figure 3:
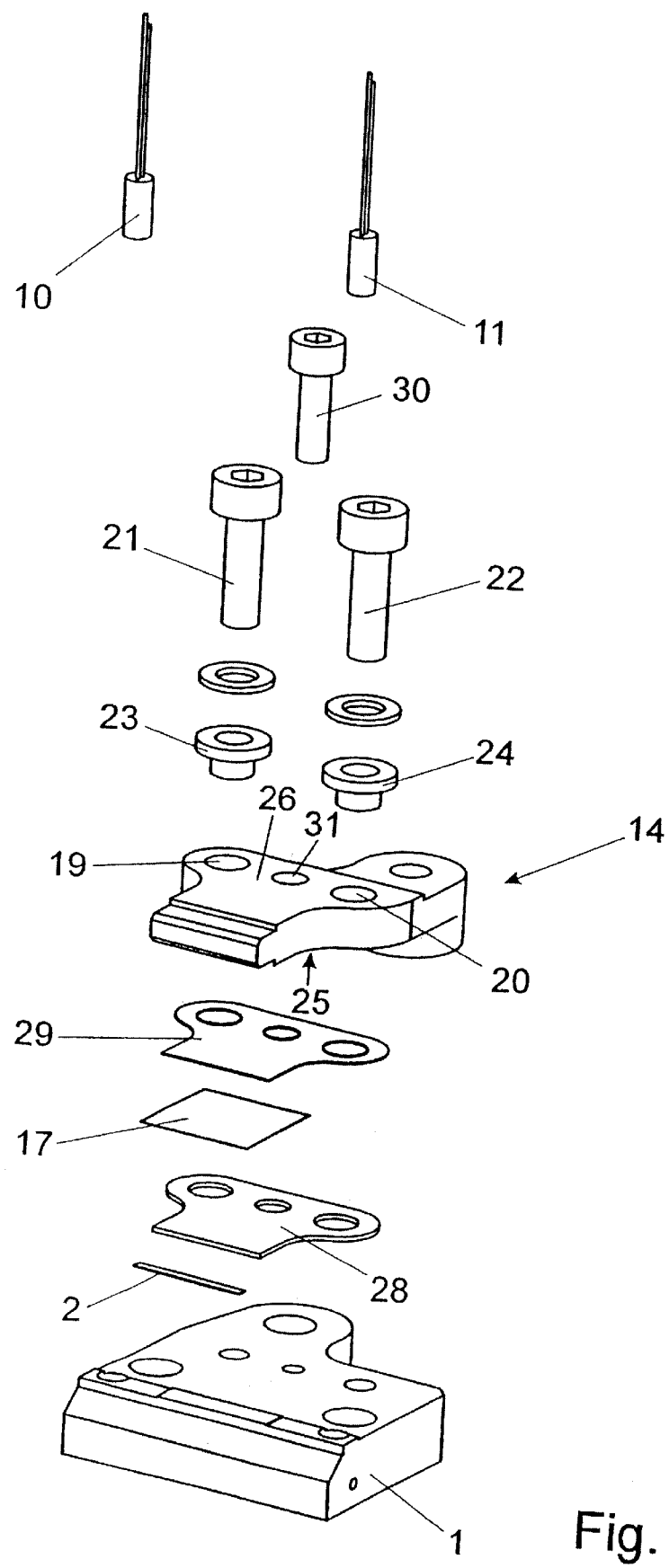
FIG. 3 is an exploded view showing a diode laser component using a heatsink with improved heat spreading.
Figure 4:
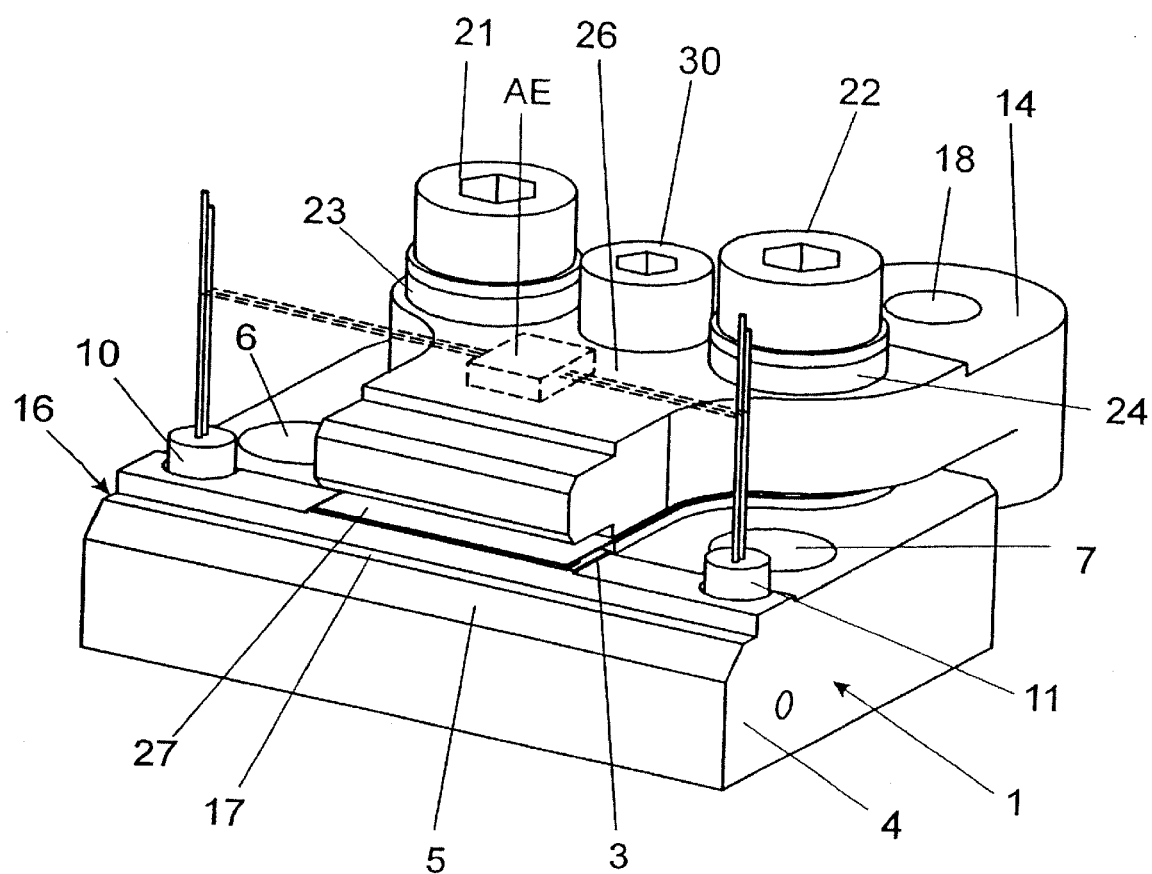
FIG. 4 shows the diode laser component in the assembled state.

The diode laser components in FIGS. 3 and 4 use one of the heatsinks according to FIGS. 1 and 2.

Similar to heatsink 1, the electrically conductive cover element 14 for the diode laser bar 2 has, as a screw connection for a power cable, a threaded bore hole 18 which is arranged eccentrically opposite to the position of the diode laser bar 2. The diameter of the threaded bore hole 18 is smaller compared to that of the threaded bore hole 15 so as to prevent confusion. Bore holes 19, 20, through which fastening screws 21, 22 can be guided for connecting the heatsink 1 with the cover element 14, are arranged in the cover element 14 so as to be adapted to the threaded bore holes 12 and 13. Insulating sleeves 23, 24 prevent electrical contact with the connected components.

The cover element 14 also only extends beyond one of the bore holes 19 or 20 in a direction opposite to the diode laser bar 2 on the half in which the threaded bore hole 18 is located. However, the thermally relevant area retains its symmetrical construction. Since the base surface 25 and top surface 26 of the cover element 14 are suitable, by design, as connection surfaces connecting to the heatsink 1, the diode laser component can be adapted for different uses through the choice of connection surface.

An electrically conducting plate 27 is fastened on the n-side to the diode laser bar 2 soldered to the mounting surface at the p-side; the electrically conducting plate 27 which is connected with an insulating plate 28 for tension relief and which is mechanically decoupled by an upper intermediate plate 29 makes electric contact with the cover element 14. The insulating plate 28 serves to separate the heatsink 1 electrically from the cover element 14.

A short-circuit screw 30, for which a bore hole 31 and a threaded bore hole 32 are arranged between bore holes 19, 20 and 12, 13, respectively, serves to protect the diode laser bar 2 until the diode laser component is electrically connected and is then removed when put into operation.

Other materials such as copper tungsten or copper molybdenum, whose thermal expansion coefficient can correspond to that of GaAs, can be used instead of the copper preferably used for the heatsink.

In a particularly advantageous construction of the diode laser component according to the invention, a graphite core 33 is arranged in the heatsink 1 in the area for heat spreading (FIG. 2). Since graphite has thermal conductivity corresponding to that of a diamond in two spatial directions, a suitable orientation of the graphite core 33 leads to an additional enlargement of the heat spreading area in at least one spatial direction. The graphite core 33 must be encapsulated within the rest of the heatsink material inside the heatsink 1 because of its very low strength. In this construction, the area for heat spreading comprising two materials accordingly remains enclosed by material and its material structure is without recesses, just as it is when composed of an individual material. In this case, the presence of recesses in the area for heat spreading would even be especially obstructive for the heat spreading. An area enclosed by material surrounding the mounting surface 3 on all edges proves particularly advantageous for encapsulation because, in this way, the graphite core 33 can be placed entirely below the mounting surface 3. For this reason, the thickness of the graphite core 33 which is encapsulated in the area for heat spreading in FIG. 2 also does not exceed the thickness dimension of the heatsink 1 in the area of the projection 4, which is determined in this case by the distance from the base surface 34 to the receiving surface 17.

The heat spreading can be further improved when the mounting surface 3 is applied as a metallized surface to a dielectric substrate whose heat conductivity exceeds that of metallic materials such as translucent cubic boron nitride, monocrystalline silicon carbide or CVD diamond. The substrate, which is a material part of the heatsink 1 due to a material engagement and which is shown particularly in FIGS. 1, 2 and 4 as a protuberance below the mounting surface 3, can also comprise partial substrates arranged adjacent to one another and can extend to the projection 4 in the emission direction E for improved heat spreading.

A particularly advantageous construction for the heatsink 1 results when the graphite core 33 is combined with copper tungsten or copper molybdenum as another encapsulating heatsink material and with a metallized dielectric substrate in the form of monocrystalline silicon carbide, since the coefficient of expansion of the silicon carbide and the rest of the heatsink material is similar to the diode laser bar 2 comprising GaAs.

While the foregoing description and drawings represent the present invention, it will be obvious to those skilled in the art that various changes may be made therein without departing from the true spirit and scope of the present invention.

What is claimed is:

1. A diode laser component comprising:
   a diode laser bar;
   a passive cooling heatsink having a mounting surface on which the diode laser bar is mounted; and
   a cover element for the diode laser bar;
   said heatsink and said cover element being constructed so as to be electrically conductive for electrical contact to said diode laser bar can containing recesses for fastening of elements;
   said heatsink containing an area for heat spreading;
   said recesses for fastening of elements being arranged in the heatsink outside of said area for heat spreading;
   wherein a bore hole which receives a temperature sensor and which is adjacent to the area for heat spreading adjoins the mounting surface on at least one side in direction penpendicular to the emission direction of the diode laser bar.

2. The diode laser component according to claim 1, wherein a part of the heatsink located in front of the mounting surface in the emitting direction of the diode laser bar has a bevel having an angle of inclination that is adapted to the radiating angle of the diode laser bar for unobstructed beam propagation.

3. The diode laser component according to claim 2, wherein the heatsink contains a step between the mounting surface and the bevel, which step has a receiving surface extending parallel to the mounting surface for optical imaging elements.

4. The diode laser component according to claim 2, wherein one bore hole of a pair of bore holes of the mounting surface which serve to receive temperature sensors adjoins the area for heat spreading in a direction perpendicular to the emission direction of the diode laser bar.

5. The diode laser component according to claim 4, wherein the distances of the bore holes for receiving temperature sensors from the mounting surface should be identical.

6. The diode laser component according to claim 1, wherein bore holes are arranged eccentrically in the heatsink and cover element on the side of the diode laser bar facing away from the emission direction for receiving electrical contacts.

7. The diode laser component according to claim 6, wherein the cover element has a base surface and a top surface, both of which are suitable as connection surfaces for connecting to the heatsink, so that the bore holes which are arranged eccentrically in the heatsink and cover element are located next to one another in a direction perpendicular to the emission direction of the diode laser bar or coaxially one over the other, depending on the choice of connection surface.

8. The diode laser component according to claim 7, wherein the bore holes for receiving electric contacts are constructed as threaded bore holes with different diameters.

9. The diode laser component according to claim 1, wherein the heatsink has an electrically insulating layer on its underside.

10. The diode laser component according to claim 1, wherein the heatsink and the cover element are electrically short-circuited with one another.

11. The diode laser component according to claim 1, wherein the area for heat spreading which is enclosed by material comprises one material.

12. The diode laser component according to claim 1, wherein the area for heat spreading which is enclosed by material comprises different materials.

13. The diode laser component according to claim 12, wherein the area for heat spreading which is enclosed by material contains at least one graphite core which is enclosed by another heatsink material.

14. The diode laser component according to claim 13, wherein copper tungsten or copper molybdenum is used as another heatsink material in combination with the enclosed graphite core, and wherein the mounting surface is arranged on a metallized substrate which is provided as a material part of the heatsink and which comprises monocrystalline silicon carbide.

15. The diode laser component according to claim 1, wherein the mounting surface is arranged on a metallized substrate which is provided as a material part of the heatsink and whose heat conductivity exceeds that of metals.

16. The diode laser component according to claim 15, wherein the substrate comprises partial substrates arranged next to one another.

17. The diode laser component according to claim 1, wherein the cover element is adapted to carry an electronic evaluating device for detecting measurements, converting measurements and possibly also for storing measurements.

18. The diode laser component according to claim 1, wherein the heatsink is adapted to carry an electronic evaluating device for detecting measurements, converting measurements and possibly also for storing measurements.

19. A diode laser component comprising:

a diode laser bar;

a passive cooling heatsink having a mounting surface on which the diode laser bar is mounted and which is offset to the rear relative to a border of the heatsink situated in an emitting direction of the diode laser bar; and a cover element for the diode laser bar;

said heatsink and said cover element being constructed so as to be electrically conductive for electrical contact to said diode laser bar and containing recesses for fastening of elements;

said heatsink containing an area for heat spreading of cohesive material structure which widens below the mounting surface to all side surfaces of the heatsink;

said recesses for fastening of elements being arranged in the heatsink outside of said area for heat spreading;

wherein a bore hole which receives a temperature sensor and which is adjacent to the area for heat spreading adjoins the mounting surface on at least one side in direction perpendicular to the emission direction of the diode laser bar.

20. A diode laser component comprising:

a diode laser bar;

a passive cooling heatsink having a mounting surface on which the diode laser bar is mounted; and a cover element for the diode laser bar;

said heatsink and said cover element being constructed so as to be electrically conductive for electrical contact to said diode laser bar and containing recesses for fastening of elements;

said heatsink containing an area for heat spreading;

said recesses for fastening of elements being arranged in the heatsink outside of said area for heat spreading;

wherein the cover element is adapted to carry an electronic evaluating device for detecting measurements, converting measurements and possibly also for storing measurements.

21. A diode laser component comprising:

a diode laser bar;

a passive cooling heatsink having a mounting surface on which the diode laser bar is mounted and which is offset to the rear relative to a border of the heatsink situated in an emitting direction of the diode laser bar; and a cover element for the diode laser bar;

said heatsink and said cover, element being constructed so as to be electrically conductive for electrical contact to said diode laser bar and containing recesses for fastening of elements;

said heatsink containing an area for heat spreading which widens below the mounting surface to all side surfaces of the heatsink;

said recesses for fastening of elements being arranged in the heatsink outside of said area for heat spreading;

wherein the cover element is adapted to carry an electronic evaluating device for detecting measurements, converting measurements and possibly also for storing measurements.

22. A diode laser component comprising:

a diode laser bar;

a passive cooling heatsink having a mounting surface on which the diode laser bar is mounted; and a cover element for the diode laser bar;

said heatsink and said cover element being constructed so as to be electrically conductive for electrical contact to said diode laser bar and containing recesses for fastening of elements;

said heatsink containing an area for heat spreading;

said recesses for fastening of elements being arranged in the heatsink outside of said area for heat spreading;

wherein the heatsink is adapted to carry an electronic evaluating device for detecting measurements, converting measurements and possibly also for storing measurements.

23. A diode laser component comprising:

a diode laser bar;

a passive cooling heatsink having a mounting surface on which the diode laser bar is mounted and which is offset to the rear relative to a border of the heatsink situated in an emitting direction of the diode laser bar; and a cover element for the diode laser bar;

said heatsink and said cover element being constructed so as to be electrically conductive for electrical contact to said diode laser bar and containing recesses for fastening of elements;

said heatsink containing an area for heat spreading of cohesive material structure which widens below the mounting surface to all side surfaces of the heatsink;

said recesses for fastening of elements being arranged in the heatsink outside of said area for heat spreading;

wherein the heatsink is adapted to carry an electronic evaluating device for detecting measurements, converting measurements and possibly also for storing measurements.

24. A diode laser component comprising:

a diode laser bar;

a passive cooling heatsink having a mounting surface on which the diode laser bar is mounted; and a cover element for the diode laser bar;

said heatsink and said cover element being constructed so as to be electrically conductive for electrical contact to said diode laser bar and containing recesses for fastening of elements;

said heatsink containing an area for heat spreading;

said recesses for fastening of elements being arranged in the heatsink outside of said area for heat spreading;

wherein bore holes are arranged eccentrically in the heatsink and cover element on the side of the diode laser bar facing away from the emission direction for receiving electrical contacts;

wherein the cover element has a base surface and a top surface, both of which are suitable as connection surfaces for connecting to the heatsink, so that the bore boles which are arranged eccentrically in the heatsink and cover element are located next to one another in a direction perpendicular to the emission direction of the diode laser bar or coaxially one over the other, depending on the choice of connection surface.

25. The diode laser component according to claim 24, wherein the bore holes for receiving electric contacts are constructed as threaded bore holes with different diameters.

26. The diode laser component according to claim 24, wherein a part of the heatsink located in front of the mounting surface in the emitting direction of the diode laser bar has a bevel having an angle of inclination that is adapted to the radiating angle of the diode laser bar for unobstructed beam propagation.

27. The diode laser component according to claim 26, wherein the heatsink contains a step between the mounting surface and the bevel, which step has a receiving surface extending parallel to the mounting surface for optical imaging elements.

28. The diode laser component according to claim 26, wherein a bore bole which receives a temperature sensor and which is adjacent to the area for heat spreading adjoins the mounting surface on at least one side in a direction perpendicular to the emission direction of the diode laser bar.

29. The diode laser component according to claims 28, wherein one bore bole of a pair of bore holes of the mounting surface which serve to receive temperature sensors adjoins the area for heat spreading in a direction perpendicular to the emission direction of the diode laser bar.

30. The diode laser component according to claim 29, wherein the distances of the bore holes for receiving temperature sensors from the mounting surface should be identical.

31. The diode laser component according to claim 24, wherein the heatsink has an electrically insulating layer on its underside.

32. The diode laser component according to claim 24, wherein the heatsink and the cover element are electrically short-circuited with one another.

33. The diode laser component according to claim 24, wherein the area for heat spreading which is enclosed by material comprises one material.

34. The diode laser component according to claim 24, wherein the area for heat spreading which is enclosed by material comprises different materials.

35. The diode laser component according to claim 34, wherein the area for heat spreading which is enclosed by material contains at least one graphite core which is enclosed by another heatsink material.

36. The diode laser component according to claim 35, copper tungsten or copper molybdenum is used as another heatsink material in combination with the enclosed graphite core, and wherein the mounting surface is arranged on a metallized substrate which is provided as a material part of the heatsink and which comprises monocrystalline silicon carbide.

37. The diode laser component according to claim 24, wherein the mounting surface is arranged on a metallized substrate which is provided as a material part of the heatsink and whose heat conductivity exceeds that of metals.

38. The diode laser component according to claim 37, wherein the substrate comprises partial substrates arranged next to one another.

39. A diode laser component comprising:

a diode laser bar;

a passive cooling heatsink having a mounting surface on which the diode laser bar is mounted and which is offset to the rear relative to a border of the heatsink situated in an emitting direction of the diode laser bar; and a cover element for the diode laser bar;

said heatsink and said cover element being constructed so as to be electrically conductive for electrical contact to said diode laser bar and containing recesses for fastening of elements;

said heatsink containing an area for heat spreading of cohesive material structure which widens below the mounting surface to all side surfaces of the heatsink;

said recesses for fastening of elements being arranged in the heatsink outside of said area for heat spreading;

wherein bore holes are arranged eccentrically in the heatsink and cover element on the side of the diode laser bar facing away from the emission direction for receiving electrical contacts;

wherein the cover element has a base surface and a top surface, both of which are suitable as connection surfaces for connecting to the heatsink, so that the bore holes which are arranged eccentrically in the heatsink and cover element are located next to one another in a direction perpendicular to the emission direction of the diode laser bar or coaxially one over the other, depending on the choice of connection surface.

* * * * *